United States Patent [19]

Boden et al.

[11] Patent Number: 5,009,865
[45] Date of Patent: Apr. 23, 1991

[54] BAR AND CRUCIBLE MAGNETIC SUSPENSION FOR A CRYSTAL-GROWING APPARATUS

[75] Inventors: Karl Boden, Jülich; Harald Ibach, Aachen-Verlautenheide; Udo Linke, Düen, all of Fed. Rep. of Germany

[73] Assignee: Kernforschungsanlage Jülich GmbH, Jülich, Fed. Rep. of Germany

[21] Appl. No.: 772,557

[22] Filed: Sep. 4, 1985

[30] Foreign Application Priority Data

Sep. 4, 1984 [DE] Fed. Rep. of Germany ....... 3432467

[51] Int. Cl.$^5$ ..................... C30B 35/00; C30B 15/30
[52] U.S. Cl. .................... 422/249; 136/617.1; 136/618.1; 136/620.73; 136/620.74
[58] Field of Search ............. 422/249; 156/616 R, 156/617 R, 617 SP, 618

[56] References Cited

U.S. PATENT DOCUMENTS

| | | | |
|---|---|---|---|
| 2,664,496 | 12/1953 | Brace | 422/249 |
| 3,074,785 | 1/1963 | Gremmelmaier | 422/249 |
| 3,154,384 | 9/1964 | Jones | 422/249 |
| 3,203,768 | 8/1965 | Tiller et al. | 156/616 R |
| 3,211,881 | 10/1965 | Jablonski et al. | 156/620 |
| 3,401,021 | 9/1968 | Tiller et al. | 156/616 R |
| 4,284,605 | 10/1981 | Pierrat | 422/249 |

FOREIGN PATENT DOCUMENTS 993880   6/1965   United Kingdom .......... 156/617 SP

*Primary Examiner*—John Doll
*Assistant Examiner*—Robert M. Kunemund
*Attorney, Agent, or Firm*—Herbert Dubno

[57] ABSTRACT

A crystalline bar is drawn by a zone-melting process or from a melt in a crucible utilizing a magnetic suspension housing, in addition to an axial stabilization magnet, a radial stabilizer surrounding the core and including sensors for the radial position of the core-operating controllers for electromagnets surrounding the core to restore the core to its setpoint position. The fully magnetic suspension of the core eliminates friction while allowing enclosure of the crystal growth compartment to improve the quality of the crystal growth process.

20 Claims, 6 Drawing Sheets

BAR AND CRUCIBLE MAGNETIC SUSPENSION FOR A CRYSTAL-GROWING APPARATUS

CROSS REFERENCE TO RELATED APPLICATION

This application is related to our commonly assigned, concurrently filed conceding application Ser. No. 772,558 now U.S. Pat. No 4,708,764 and to the German Applications P 34 32 467.4 filed 4 Sept. 1984 and P 35 30 417.0 filed 9 Aug. 1985 upon which that application is based.

Field of the Invention

Our present invention relates to a magnetic suspension for a crystal-growing apparatus and, specifically, to a zone-melting or crucibleless growing apparatus as well as to an apparatus from which a crystal is drawn from a crucible containing a melt. More particularly, the invention relates to a magnetic suspension, where the crystal is drawn in the form of a bar member generally along a crystal growth axis upon molten material which can be contained in a crucible referred to as a source member or derives from another bar of the material which must be zone melted and likewise referred to herein as a source member, connected to at least one of these members, i.e. the crystal member or the source member is provided with a magnetic suspension according to the invention of a type more fully described below.

BACKGROUND OF THE INVENTION

In German patent 23 06 755 there is described a crystal bar or crucible holder for devices for crucibleless zone melting and for crystal drawn from a crucible, utilizing magnetic principles and in which a magnetizable core is suspended from a magnet which may be referred to herein as an axial stabilizing magnet since its function is to fix the core axially with respect to this magnet or coil, the device being then axially shifted.

The means for displacing the melt along the growth axis generally comprises entraining electromagnets located outside the zone-melting chamber.

During the axial displacement, therefore, the ferromagnetic core slides along the melt chamber wall so that vibration or chattering resulting from the frictional contact of the core with this wall may result and give rise to spontaneous defects in the crystal growth. Because of the contact of the wall of the melting chamber with the core, external influences on the apparatus in the form of vibration or shocks also cannot be prevented from detrimentally affecting the crystal growth process.

OBJECTS OF THE INVENTION

It is, therefore, the principal object of the present invention to provide an improved apparatus either of the zone-melting type or of the Czochralski type and drawing a crystalline bar from a melt, whereby the disadvantages discussed above are obviated.

Another object of this invention is to provide an improved apparatus of the type described which effects axial displacement of a magnetic core without the generation of vibration or transfer of shocks or disturbances to the growing crystal.

It is yet another object of our invention to provide an improved magnetic suspension which allows accurate positioning of the crystal growth axis without the disadvantages characterizing earlier crystal growth systems.

SUMMARY OF THE INVENTION

The present invention is applicable to an apparatus for growing a crystal member in the form of a bar along a crystal growth axis from molten material from a source member, at least one of these members being formed on or suspended from an elongated magnetizable core cooperating with an axial stabilization magnet which fixes the position of the core relative to that of a surrounding housing formed with the axial stabilizing magnet, and means for axially displacing the growing crystal bar relative to the melt. According to the invention, at least one radial stabilizing device is provided for the magnetizable core which comprises electromagnetic means surrounding this core and spaced by a gap therefrom, an electronic controller for this electromagnetic means and at least one position sensor juxtaposed with the core and responsive to the radial distance of the core from the sensor, the electromagnet means being energized with signals from the controller which are a function of the input received from the position sensor so that radial deviations of the magnetizable core from a predetermined setpoint orientation are detected and corrected. By the contactless juxtaposition of the magnetizable core with the electromagnet means and the magnetic axial fixation of this core during the axial displacement previously mentioned, any movements imparted to the bar in the region of crystal growth are free from the vibrations, transmitted shocks and like disturbances outlined above.

The radial stabilization unit of which two are preferably provided on each core in axially spaced relationship maintains the magnetizable core in its radial position vis-a-vis the stabilizer even with axial displacement. This axial displacement can be effected by the magnet force.

Another advantage is that the wall enclosing the growth or melting chamber need not be displaced with the magnet core as is the case in German patent 23 06 755. The suspension of the invention is thus suitable for use in a crystal-growing apparatus which may or may not have a housing enclosing the crystal-growing zone.

In the case in which a housing or chamber is provided to closely surround the crystalline body, this chamber can be under pressure and can be hermetically sealed and the wall of the enclosure or chamber can pass through or lie within the gap between the magnetizable core and the electromagnet surrounding same. In that case the wall of the housing should be composed of a nonmagnetic material.

Sliding seals or other structures in the region of the housing wall can be avoided because it is not necessary to provide mechanical parts which project through or slide along this wall. Indeed, it is a feature of the invention that the crystal bar and the magnetizable core upon which it is suspended or on which it is supported, can be completely enclosed in a sealed housing in a contactless relationship with the wall thereof.

The magnetic suspension of the invention has thus been found to be especially effective for crystal growth processes in which especially high purity atmospheres must be maintained in the growth chamber.

According to a feature of the invention the radial stabilizer magnet system may surround the core and have an annular or ring-shaped configuration so that an annular gap is defined between the magnetizable core and this magnet system.

It has been found to be advantageous to provide the magnetic path of the electromagnet of the radial stabilization unit with a substantially radially directed premagnetization, preferably generated by one or more permanent magnets, thereby increasing the radial field, with the controlled electromagnets forming only a small part of the field.

This, for example, allows the use of annular gaps with a gap width in excess of 13 mm, the comparatively large gap width allowing the accommodation of a wall of a comparatively thick-walled high pressure vessel therein to enclose the crystal-growing region. Even with comparatively thick-walled vessels, the available gap width can be sufficient to enable it to accommodate additional tempering elements, i.e. elements for controlling the temperature of the housing wall, e.g. for controlled heating thereof or for cooling the radial stabilizing unit and its magnets, or for providing a corrosion-resistant coating or cladding for the vessel and the suspension.

These features have been found to be especially important for the growth of monocrystals from so-called III-V compounds, i.e. compounds formed from the elements of groups III and V of the Periodic Table, especially GaAs (galium arsenide), InP (indium phosphide) and GaP (gallium phosphide).

This group of crystals contains volatile components which have a tendency to evaporate from the melt and thus there is an enrichment of the gas atmosphere in the growth chamber in these components and a simultaneous reduction in the concentrations of these components in the melt.

Since any reduction in the concentration of a desired component in the melt can alter the composition of the crystals grown, we advantageously reduce the tendency toward loss of an essential component from the melt by maintaining comparatively elevated pressures in the growth chamber, i.e. a pressure in the growth chamber which is above or equal to the equilibrium or dissociation pressure in the melt.

For example, with a melt temperature of 1239° C. for gallium arsenide, this pressure need only be 0.89 atmospheres for the volatile arsenic, although that at a melt temperature 1070° C. for indium phosphide, the pressure must be 60 atmospheres to avoid loss of the phosphorus from the melt.

To prevent sublimation or condensation of the volatile components, all surfaces exposed in the growth chamber must be maintained at a temperature above the sublimation or condensation point and this is effected by heating the chamber walls by the tempering elements mentioned previously and described in greater detail below. The inner surfaces at least of the chamber walls are preferably composed of quartz glass and graphite and it is possible to coat both the magnetizable core or any exposed surfaces within the growth chamber with quartz glass or graphite to minimize corrosion phenomena.

According to a further feature of the invention, the axial stabilizing magnet is so disposed that it is located directly above the electromagnets of the radial stabilizing unit so that its magnetic field is superimposed upon the radial stabilizing magnet field in the gap of the latter unit and provides the premagnetization.

The displacement in the axial direction of the device for growth of the crystal can be effected in various ways. For example, the stabilizing magnet can be mounted in a fastening frame which in turn can be supported and can be axially displaced relative to a support, e.g. by a threaded spindle or fluid-cylinder drive.

An especially elegant way of effecting the axial displacement, according to the invention, is to provide an electromagnetic linear motor which acts upon the magnetizable core so that both the axial stabilization and the axial displacement can be effected by magnetic field forces. Obviously this arrangement eliminates the need for any mechanically movable parts.

It has been found to be advantageous, moreover, to provide an annular rotary field stator around the magnetizable core and defining an annular gap therewith This allows a rotation to be superimposed upon the axial displacement of the core as may be desirable for the growth of certain qualities in monocrystals.

According to yet another feature of the invention, a force-measuring unit is provided to respond to the change in the supported load through the magnetic suspension of the invention and hence to the growth of the crystal, the force or the suspension being directly related to the weight change of the growing crystal.

Because the force-measuring unit is acted upon by the outer or magnetic component of the suspension and the suspension is coupled exclusively by magnetic field forces to the core and to the crystal, the detection of the crystal weight gain is effected in a completely frictionless manner.

The force-measuring unit can be provided between a support and the aforementioned stator. Esepcially when the growth chamber is completely enclosed and hermetically sealed, the means for measuring the growth of the crystal and hence controlling the parameters of the crystal drawing apparatus can be free from the effects of corrosion, pressure, growth temperature and even phenomena resulting from the use of slip ring so that the weight change measurement can be obtained without perturbations, signal drift and the effects of friction phenomena with high precision and stability. The control of the crystal-growing operation is thereby greatly enchanced.

The growth-measuring unit is thus also comparatively simple and inexpensive since all need for slip rings, feed-through devices in the pressure vessel shielding, additional cooling units and means for protecting the measuring unit against corrosion or for compensation for distortions of the measured values can be eliminated.

The force-measuring unit can be provided directly below the axial stabilizing magnets or the linear motor or under the entire assembly of the linear motor, radial stabilizing units or like structures.

These structures can be included in a hollow cylindrical stator which can form part of a rotary drive motor although the rotary drive motor need not be used.

A precise measurement of the weight change of the crystalline body is especially advantageous for control of the crucible melt crystal-drawing process according to Czochalski: Because of the economics of the method and the crystal quality required, the monocrystal must be drawn over the usable length with a constant diameter. The parameters which control the diameter of the growing crystal most significantly are the melt temperature and the axial speed of movement of the crystal and these parameters must be continuously controlled over long periods of time. One of the actual value measurements useful for this purpose is the weight change of the growing crystal and it is for this reason that the actual value of this weight change is detected, compared with a setpoint value and the difference between the setpoint and the actual values determined. The difference signal is used to control the heating of the melt and/or the speed of the axial displacement.

Since the measured weight change is extremely small and by comparison to the friction forces which arose in earlier systems, it has not been practical to provide a defect-free measurement in the past of the actual weight change sufficient for control purposes. This is especially problematical when the measuring device must be subjected to thermal effects and other phenomena causing signal drift, or where slip rings were required because the crystal was rotated during growth. All of these detrimental influences are eliminated according to the invention which also avoids the danger of leakage.

A radial shifting of the axis of the crystal body on the magnetizable core can be effected by providing the externally disposed electromagnet elements of the radial stabilizer so that these can be readily displaced.

BRIEF DESCRIPTION OF THE DRAWING

The above and other objects, features and advantages of the present invention will become more readily apparent from the following description, reference being made to the accompanying drawing, in which.

SPECIFIC DESCRIPTION

Figure 1:
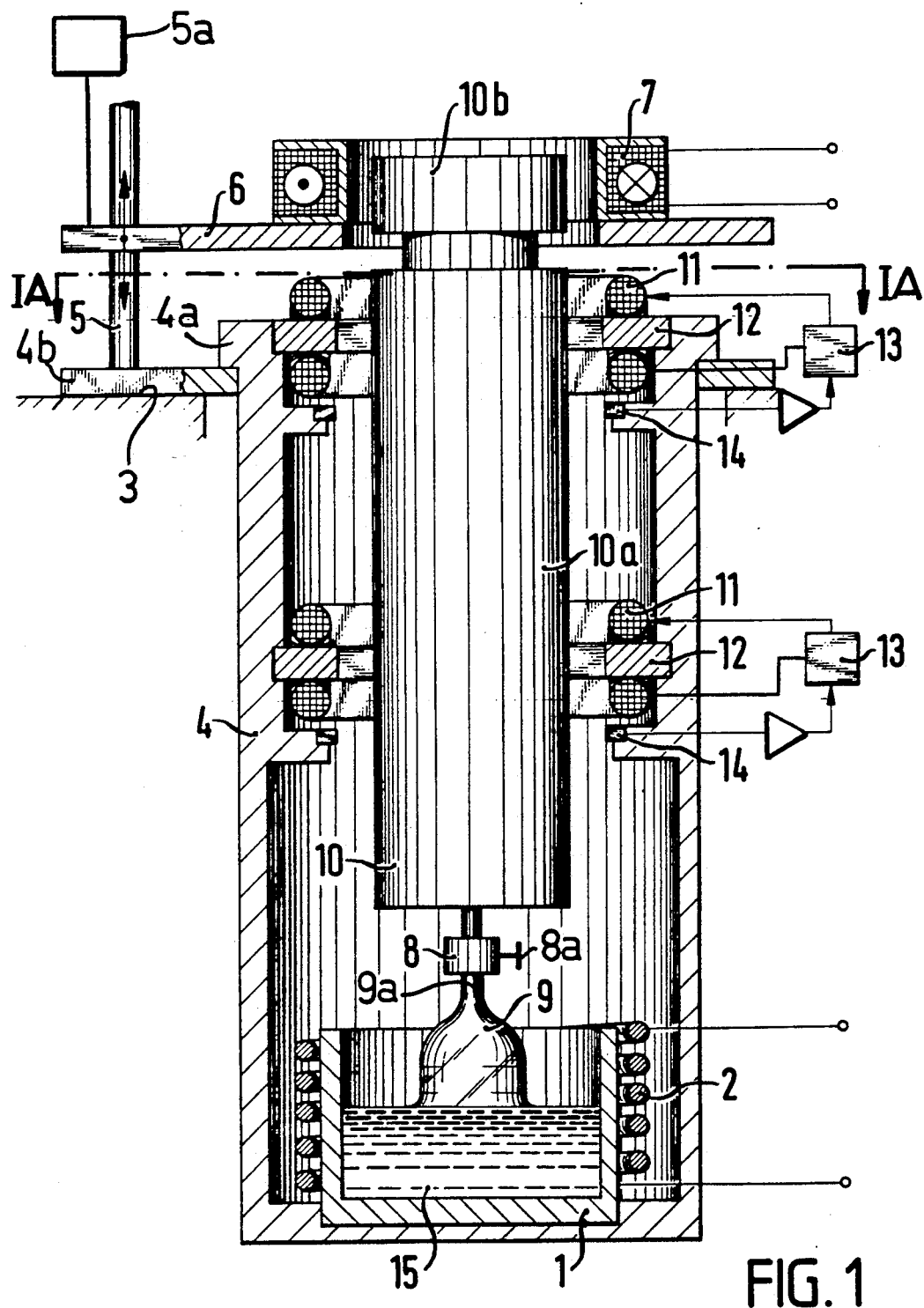
FIG. 1 is a vertical section through an apparatus for drawing a crystal from a crucible in which the seed crystal is displaced with respect to the stationary crucible and provided with a magnetic holder arrangement for the device carrying the seed crystal according to the invention.
Figure 1A:
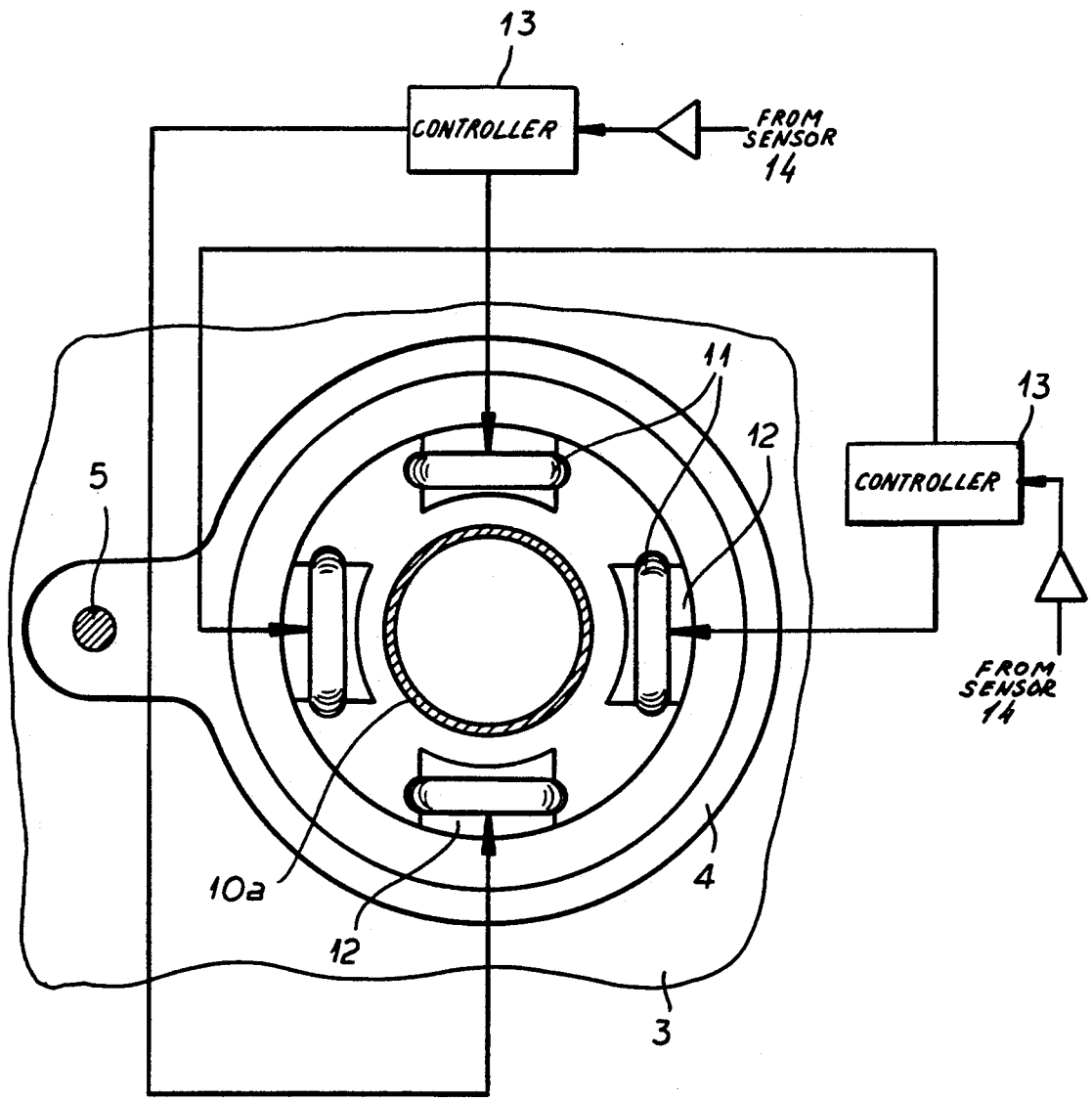
FIG. 1A is a section generally along the line IA—IA of FIG. 1.

The apparatus shown in FIGS. 1 and 1A comprises a melting crucible 1 provided with a resistance heater 2 for maintaining a melt 15 of the material, e.g. a III-V melt silicon or germanium, from which a bar 9 of the material is to be drawn utilizing a seed crystal 9a removably attached to the apparatus by a holder 8 which is shown to have a screw 8a allowing the seed crystal to be fixed in place.

The melting crucible 1 is shown to be seated in the base of a frame 4 which is supported by a flange 4a upon a bracket 4b resting upon a fixed support 3. The frame 4 is also referred to as a fastening frame since other parts of the radial stabilization system of the invention are affixed therein or thereto.

The bracket 4b serves to mount a post 5 of a raising and lowering unit which includes a holding plate 6 and a vertical drive 5a shown only diagrammatically in this Figure. The holding plate 6 carries an electromagnetic coil 7 which has a magnetizable core 10 whose upper portion 10b is a cylindrical permanent magnet and can be received in the coil 7. The lower portion of this core 10 is a hollow elongated magnetizable cylinder 10a composed of stainless steel which is magnetically attractable.

The electromagnet coil 7 is positioned at such a height that it surrounds the permanent magnet 10b and upon energization can fix the electromagnet core 10b in its axial relationship to the coil 7. The upward movement of the plate 6 is effected by the drive 5a which can be an electric motor-threaded spindle drive or a hydraulic cylinder drive.

Two radial stabilizers are provided in the support frame 4, each comprising four coils 11 with ferromagnetic cores 12.

These coils and the respective cores are disposed in opposing pairs of which only the pair of each stabilizer unit in the plane of the drawing has been illustrated in FIG. 1 although all four coils of the upper stabilizer can be seen in FIG. 1A.

These coils are connected to respective electronic controllers 13 in pairs and are engaged by a direct current whose level is dependent upon a measurement signal derived from the inductive sensors 14 and supplied through the controllers 13. The energization circuitry for these radial stabilizing coils is more fully described in connection with our copending application Ser. No. 772,558 filed concurrently herewith and based upon German patent applications P 34 32 467 4 and P 35 30 417.0 filed respectively 4 Sept. 1984 and 9 Aug. 1985 and incorporated herein by reference.

The signals from the inductive sensors are amplified and are subject to a phase shift before being supplied as output signals in the form of a regulated direct current by the controllers 13 to the coils 11.

During the production of a crystal bar, the crystal 9 is drawn from the melt 15 by vertical movement of the core 10 to which the holder 8 is affixed by energization of the electromagnet 7 and displacement of the plate 6 in the upward direction. The core is centered along the desired axis of the radial stabilizer by magnetic arrays and is maintained precisely vertical by the two vertically spaced radial stabilizers which monitor any radial deviation from proper axial positioning of the core and automatically adjust the fields of the magnet 11 to precisely position the core with concentricity.

Figure 2:
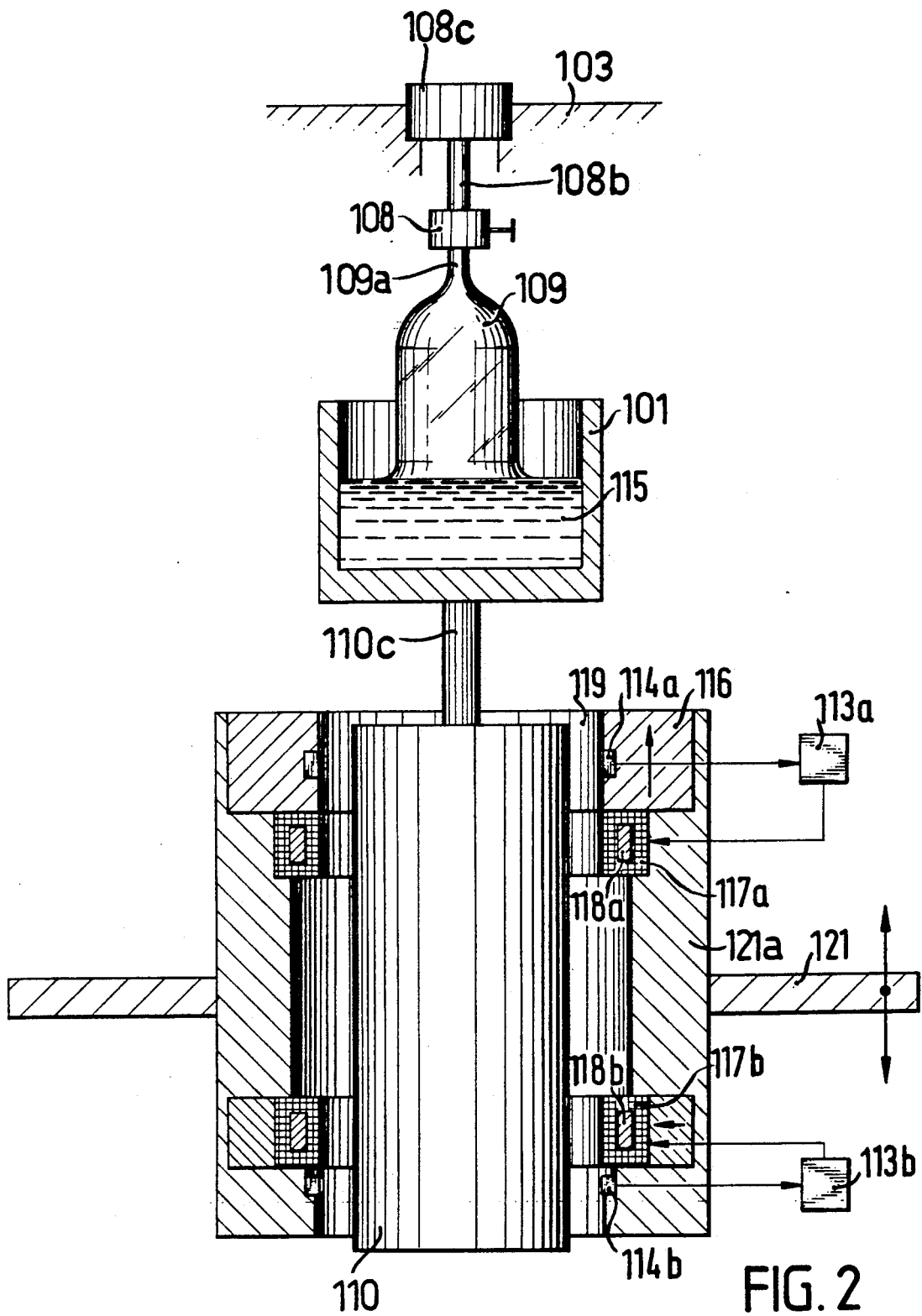
FIG. 2 is a similar view of an arrangement in which the element holding the seed crystal is fixed and the crucible is movable and the magnetic holder is provided for the crucible.

In FIG. 2 we have shown a kinematic reversal of the system of FIG. 1 wherein the crucible 101 is moved and not the crystal.

In this case, the crystal bar 109 is drawn from the melt 115 in the crucible 101 by progressively lowering the crucible while the crystal seed 109a and thus the growing crystal bar 109 are held stationary by a holder 108 or a rod 108b depending from a fixed support 108c on the carrier 103.

The core 110 is affixed to the crucible by a rod 110c and at its upper end cooperates with a permanent magnet 116 which functions as an axial stabilizing magnet and thus prevents the core from dropping uncontrolledly with respect to the housing 121a which is mounted on a plate 121. The latter can be lowered progressively to permit the crystal to grow by an appropriate vertical displacement device similar to that described in connection with FIG. 1.

Within the housing 121a in which the annular permanent magnet 116 is provided, there is an annular coil 117a with a ferromagnetic core 118a controlled by the control unit 113a utilizing magnetic field plates 114a as sensors of the proximity of the core to the magnetic field plate.

The permanent magnet provides a radially directed premagnetization in the annular gap 19 and the field plate registers deviations in the magnetic field strength resulting from movements of the core toward or away from one of the field plates associated with an annular coil. A further radial stabilizing unit consists of the annular coil 117b, the respective core 118b, the magnetic field plate sensor 114b and the control unit 113b responsive to this sensor and provided proximal to the lower end of the magnetizable core.

The annular coils can correspond to those described in German patent document DE-OS 24 20 814.

The use of magnetic field plates as magnetic field sensors is described at page 123-173 of *Galvanomagnetic Devices Data Book* 1976/77, Siemens AG, Munich, Germany, it being noted that field plates are also referred to as magneto resistors.

Naturally, other magnetic field-detecting units can be used as well.

In FIG. 2, therefore, the crystal is drawn in the manner previously described except that instead of raising the crystal, the crucible is lowered and the crystal is held stationary. The heating unit for the crucible has not be shown in FIG. 2 and will not be seen in the subsequently described Figures either. It should be noted that a respective heating unit can be used as shown in FIG. 1. Depending upon the particular magnetic suspension and radial stabilizer used, therefore, either the crucible or the crystal can be magnetically suspended.

Figure 3:
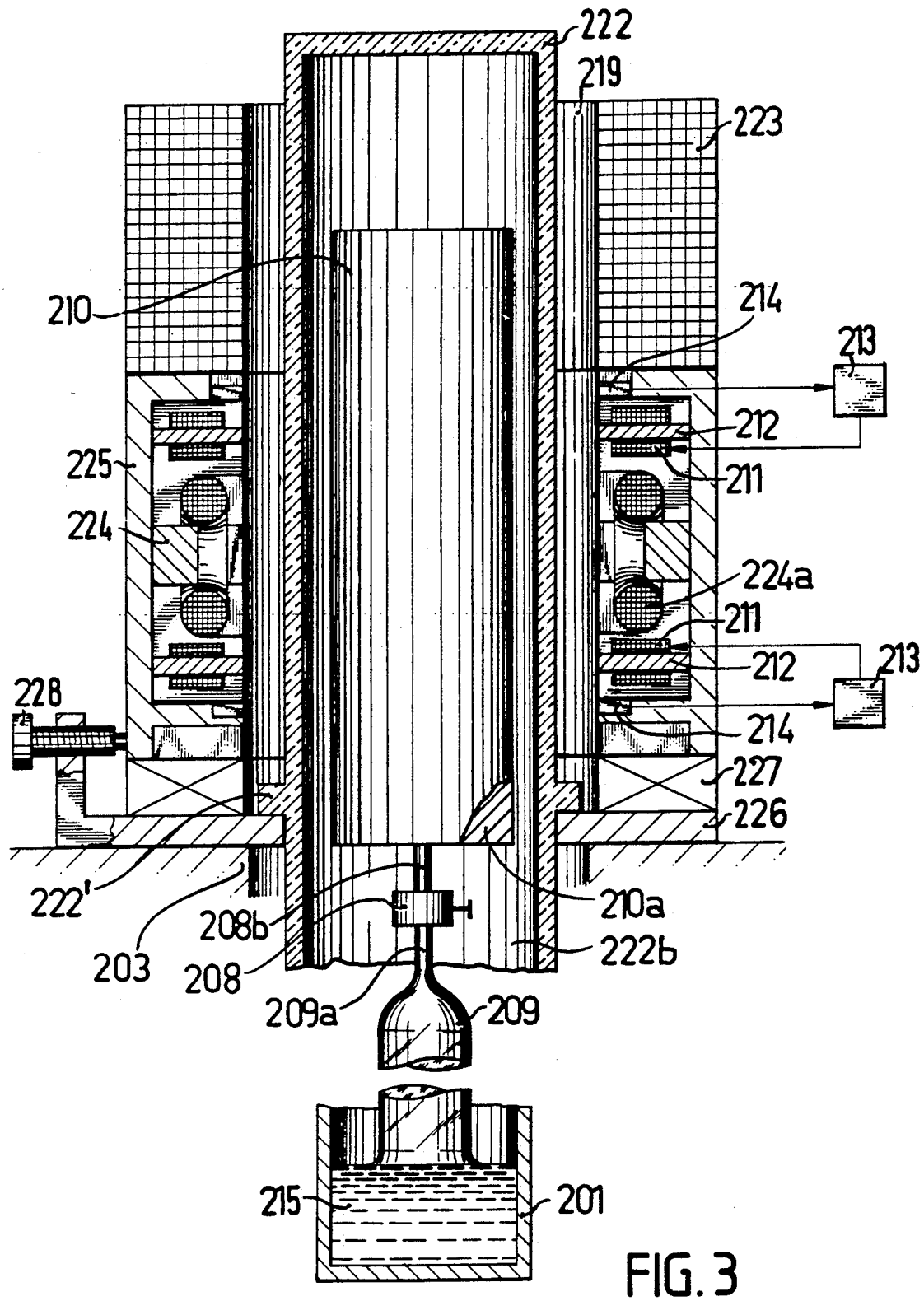
FIG. 3 is a diagrammatic and somewhat simplified axial section of another magnetic positioning holder for the crystal bar provided with a device for measuring the change of weight of the growing crystal.

In the embodiment of FIG. 3, a growth space or compartment is enclosed by the housing 222 which surrounds the growing crystal bar 209 which develops at the end of the rod 208 but to which the holder 208 for the seed 209a is affixed. The rod 208b is formed at the end of the magnetizable core 210 which is also surrounded by the housing 222 to enable the entire crystal-growing apparatus to operate at a high temperature. The core 210, therefore, likewise should be composed of a steel alloy which retains its magnetic properties at a high temperature and thus has a high Curie temperature.

By contrast, the electromagnet elements forming the radial stabilizers in axially spaced relationship are disposed externally of this housing 222.

The housing wall is thus provided in the annular gap 219 between the electromagnet and the core and at least in this region consists of a nonmagnetizable material, for example, quartz glass or a nonmagnetizable steel alloy.

The linear motor 223 is provided in the form of an annulus around the magnetizable core and acts in its working position upon the upper end of this core. The core is the subject of the radial stabilization effects of two radial stabilizing units each comprising a set of coils 211 with respective ferromagnetic cores 212, control units 213 and inductive sensors 14. A rotary field stator 224 is mechanically fixed to the stator support 225. The lower end of the stator support 225 lies directly upon a force-measuring unit 227 interposed between this stator support and a carrier 226 lying on the support strucutre 203. The member 226 also carries the housing 222 via its flange 222'.

It is possible to vertically fix the crucible 201 as shown for the crucible 1 in FIG. 1 and to vertically lift the core by magnetic force, i.e. the linear magnetic motor.

The linear motor can be composed of a simple coil retraction system wherein, for example, the core is progressively drawn into the coil to a degree determined by the electric current supplied to the coil 223 of the linear motor.

The length of the core 210 will therefore be established and the stroke of this core within the housing selected to permit the greatest length of crystal growth which is desired.

The rotary field stator 224 delivers to the magnetizable 210 a torque which sets this core and the crystal in rotation about their common vertical axis.

The energy required to rotate the crystal and the core is, however, minimal since bearings and sealing friction are eliminated.

By proper choice of material and the configuration of the magnetizable core in the region in which it is rotatably driven, synchronous motor (e.g. reluctance and hysteresis motor) or asynchronous motor (e.g. induction motor) principles may be used to rotate the core and the developing crystal.

When a hysteresis motor is formed by the stator 224 and its coil 224a, only cylindrical annular rotor elements of magnetizable steel are required. Because of the small driving power the hysteresis characteristics of this steel do not have to meet any special requirements so that the hysteresis motor portion of the core can be fabricated from the magnetizable steel of the core otherwise. As a consequence, the magnetizable core can be a continuous steel cylinder providing driving, centering and vertical displacement effects.

The weight of the stator externally of the housing 222 rests upon the force-measuring unit 227 and, since this stator is magnetically coupled to the core 210, neither the core itself nor the stator changes in weight during operation. The downward force exerted by the stator on the force-measuring unit 22 increases as a function in the change of weight of the crystal bar as it is grown.

It should be clear that this change of crystal growth weight is measured without any detrimental friction effect. When the force-measuring unit 227 consists of three force-measuring cells located at the vertices of an equilateral triangle, the addition of the three electrical outputs from these cells all represent the actual crystal growth free from nonsymmetrical or periodic perturbations resulting from wobble movements and vibration which are eliminated by cancellation.

Since the force-measuring cells are located entirely externally of the growth chamber 222b and thus all other thermal, corrosive and chamber-pressure dependent effects on the measurements are eliminated, the force-measuring unit can measure the crystal growth with time with a high degree of passage and accuracy.

The summation signal from the cells can, as described in the aforementioned copending application, and neither illustrated nor described in greater detail herein, be applied to an electrical comparator as the setpoint value input of the crystal bar diameter-control circuit. A setpoint representing the desired crystal bar diameter can be applied to this comparator a well and the difference signal applied to a controller which can, in a conventional manner, control the heating effect or the speed at which the crystal is drawn, or both, to adjust the diameter of the bar which is produced In the case in which corrosive substances can be released in the melting chamber, the magnetizable core can be provided with a corrosion-resistant coating which has been shown diagramatically at 210a in FIG. 3 and can be composed of quartz glass or graphite.

A setscrew 228 can be used to adjust the position of the stator 225 relative to the base plate 226 and the vessel 222 in the radial direction.

A plurality of such screws can be angularly equi-spaced around the stator to provide radial alignment of the crucible and crystal axis or a desired excentricity between these two axes if this is desired or required for the crystal growth process.

Figure 4:
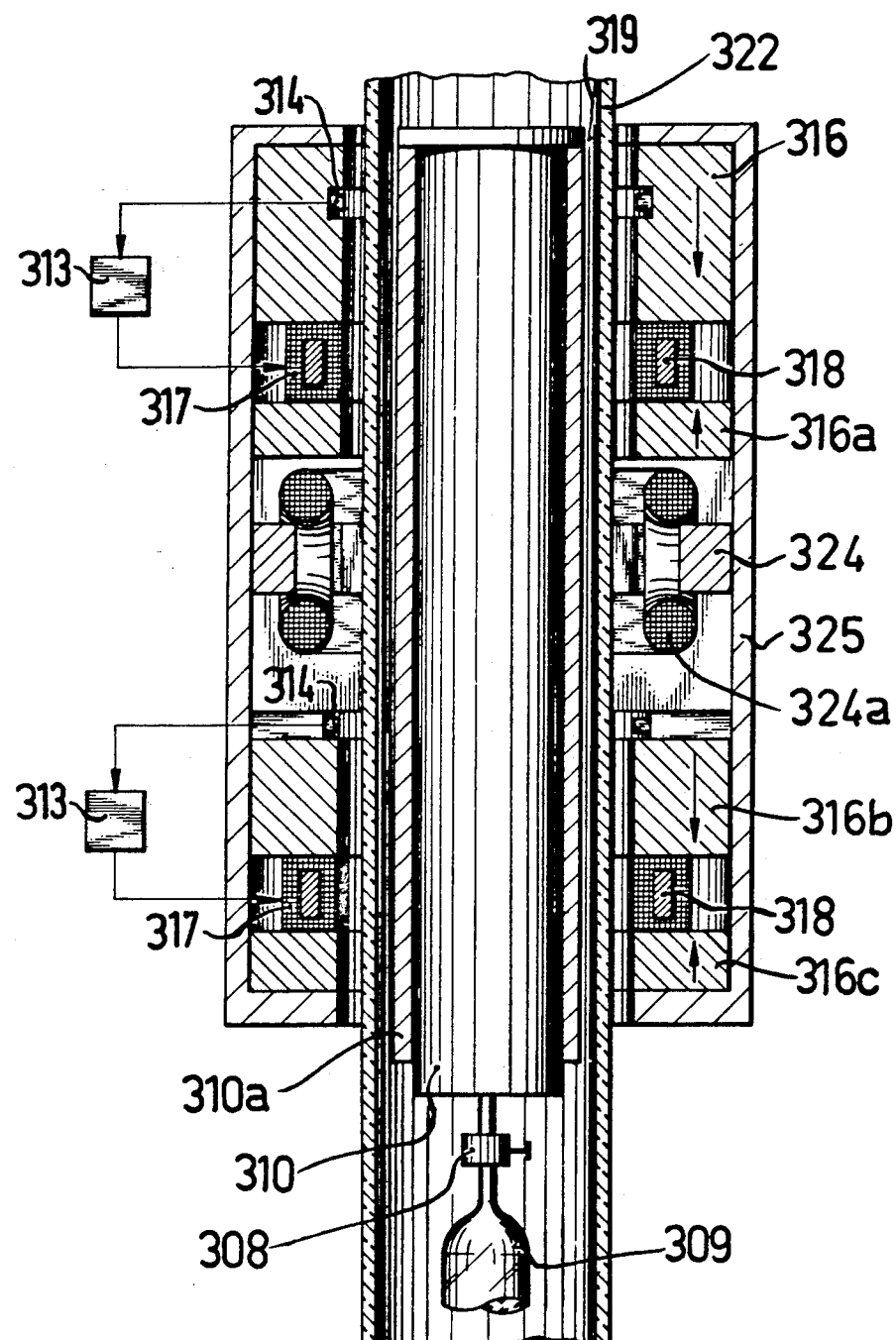
FIG. 4 is a diagrammatic and partial axial section of another embodiment of the holder of FIG. 3.

In FIG. 4 we have shown an embodiment which is functionally similar to that of FIG. 2 wherein the electromagnets of the radial stabilizing units are provided with a premagnetization in the annular gap 319 in the radial direction.

To this end, the annular coil 317 of the upper radial stabilizer unit is provided below the permanent magnet 316 forming the axial stabilizing magnet. Such an externally applied premagnetization can be, of course, electromagnetically effected although it has been found to be advantageous to use the permanent magnet 316 because this requires no supply of power, operates without introducing any perturbations and, because of its annular form, provides a well-defined stable central orientation of the axes in which radial magnetic forces acting upon the core are completely in balance.

The magnetic field forces which are applied to the magnetizable core increase as the product of the premagnetization and control field strengthens so that with correspondingly high permanent premagnetization field strengths, large dynamic stabilization forces can be generated over large gap widths (for example annular gap widths greater than 13 mm) with comparatively small electromagnetically generated control field strength.

In this embodiment as well, the growth path is enclosed in a housing 322 containing the growing crystal bar 309 which is engaged by the holder 308 attached to the lower end of the core 310. In this case, a corrosion-resistant covering or sheath 310a is seen in cross-section and protects the pressure part of the length of the core. The field plate induction sensors are provided at the gap 319 to free inputs to the controllers 313 of the radial stabilizers whose coils 317 lie between oppositely poled permanent magnets, one of which has been shown at 316 while others are shown at 316a, 316b and 316c, the arrows in these permanent magnets 316, 316a, 316b, 316c being directed in the direction of south to north polarization of the annular permanent magnets.

The outer housing or support 325 forms a stator with respect to which the stator member 324 carries the field coils 324a which can rotate the core 310 in the manner previously described.

The crucible (not shown) can be lowered using the configuration of FIG. 2 or the stator 325 can be raised utilizing the construction of FIG. 1 to draw the crystal from the melt.

Figure 5:
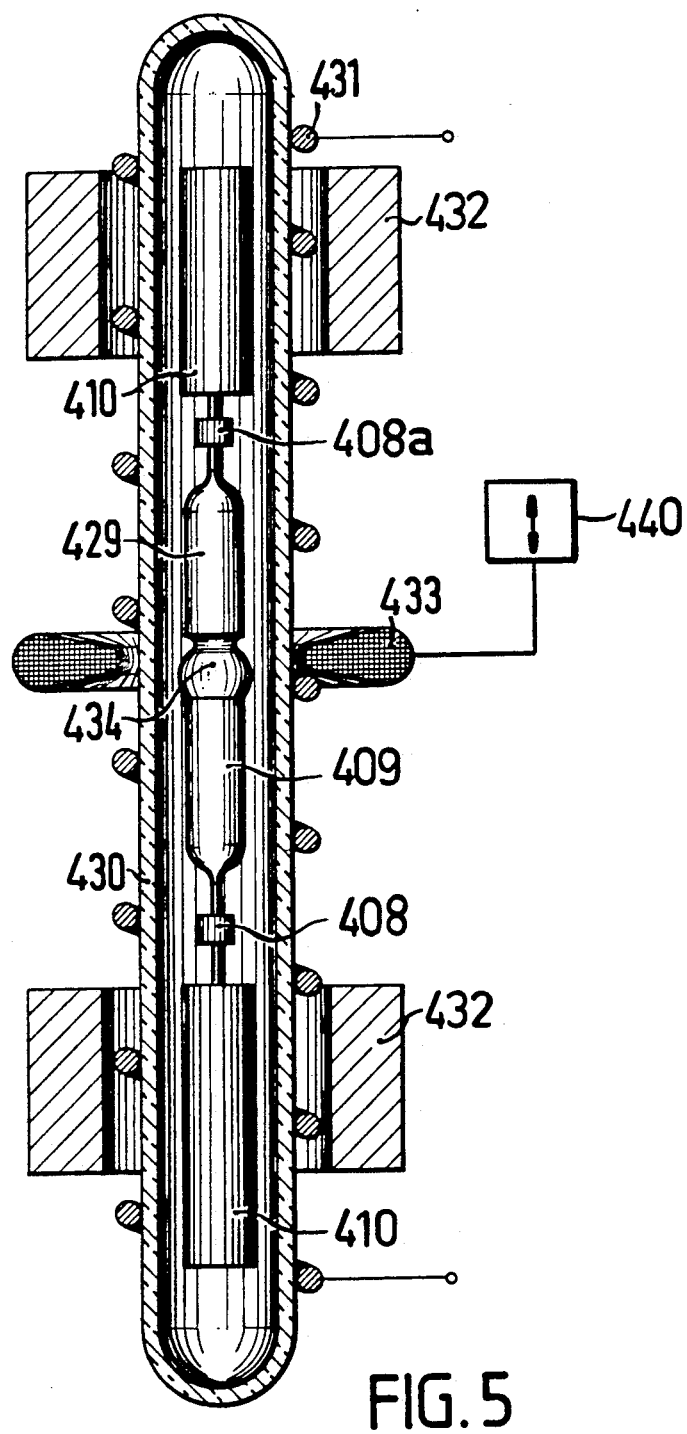
FIG. 5 is an axial section through a zone-melting apparatus according to the invention.

FIG. 5 shows the principles of the invention applied to an embodiment in which zone melting is carried out, i.e. wherein the bar 429 of the crystallizable substance is held with magnetic radial stabilization in accordance with the principles of the invention as the bar is drawn through the heating zone in which melting followed by cooling occurs.

On the opposite side of the heating and cooling zone a crystalline bar 409 of the product is formed. The crystal bar 409 is retained in a holder 408 while the supply bar 429 is retained in a holder 408a, each of the holders 408, 408a being affixed in the manner previously described, to a respective hollow cylindrical magnetizable core 410.

The growth chamber is here formed as a hermetically sealed cylindrical enclosure or ampule 430 which can be composed in whole or in part of quartz and which, although shown in one piece in FIG. 5, may be assembled from two or more parts which are joined together.

The temperature of the housing and growth chamber is controlled by a heating coil 437 while the melting zone is defined by a generally toroidal induction coil 433 surrounding the housing.

The magnetic suspension and radial orientation units are here represented only in outline form at 432 for each of the cores 410, it being understood that each of the units 432 can include a pair of radial stabilizers as illustrated in the embodiment of FIG. 4 together with means for shifting the entire assembly of housing and stabilizers axially relative to the torroidal core 433 or for moving the torroidal core 433 progressively along the housing 430 with the housing stationary. This, of course, moves the melting and cooling zone 434 progressively along the rod or bar 429 to allow the formation and growth of the crystal 409.

The means for this purpose has been represented diagrammatically at 440.

Naturally the diagrammatic illustration of FIG. 5 does not show many of the other elements which necessarily would be used in conjunction with the device, such as means for shielding the device against undesired incursion of heat, for preventing loss of heat or for cooling portions of the device which may become overheated.

Using the system of FIG. 4 in each of the units 432, the assembly of the cores 410 and the bar 409, 429 can be set into rotation as well as adjusted with respect to orientation of the axes via the radial adjustment means formed by the sensors, controllers and radial stabilizing coils.

We claim:

1. In an apparatus for growing a crystal member in the form of a bar along a crystal growth axis from molten material from a source member, the improvement which comprises in combination:

an elongated magnetizable core connected to one of said members and extending generally along said axis;

an axial stabilization magnet magnetically coupled to said core for effecting axial positioned of said core; and at least one radial stabilizer for said core, said stabilizer comprising:

a plurality of electromagnets radially juxtaposed with said core, spaced therefrom and angularly spaced around said core, an electric control unit connected to said electromagnets for automatically adjusting the fields of the electromagnets to precisely position the core with concentricity with respect to said electromagnets, and position sensing means responsive to the radial spacing of said core from said electromagnets and connected to said electric control unit for inducing changes in said fields of said electromagnets to maintain said core radially in position during the crystal growing of said bar and independently of the operation of said axial stabilization magnet for effecting axial positioning of said core.

2. The improvement defined in claim 1, further comprising means defining a growth chamber surrounding said bar and disposed in a region between said electromagnets and said core, said chamber having a wall in the region of said magnetic fields which is composed of nonmagnetizable material.

3. The improvement defined in claim 1 wherein said radial stabilizer is annular and defines an annular gap with said core disposed around said core.

4. The improvement defined in claim 3 wherein a premagnetization bridges said gap extending substantially radially between said radial stabilizer and said core and said magnetic fields are superimposed on said premagnetization.

5. The improvement defined in claim 4 wherein the premagnetization derives from at least one permanent magnet.

6. The improvement defined in claim 5 wherein said permanent magnet is said axial stabilization magnet and is disposed axially adjacent said radial stabilizer so that a portion of a magnetic field generated by said permanent magnet forms the premagnetization in said gap.

7. The improvement defined in claim 1, further comprising means for axially displacing one of said members to effect axial growth of said bar.

8. The improvement defined in claim 7 wherein the last mentioned means includes a linear electromagnetic motor acting upon said core.

9. The improvement defined in claim 8 wherein said linear motor is formed by an electromagnetic coil forming said axial stabilization magnet.

10. The improvement defined in claim 8, further comprising a stator spacedly surrounding said core and formed with a field winding energizable to rotate said core.

11. The improvement defined in claim 7 wherein said magnets are mounted on a common support and the last mentioned means includes a drive for axially displacing said support.

12. The improvement defined in claim 1, further comprising a stator spacedly juxtaposed with and coaxially surrounding said core, said stator being provided with a field winding energizable to electromagnetically retain said core.

13. The improvement defined in claim 1 wherein said axial stabilization magnet and said radial stabilizer are provided on a common support, further comprising force-measuring means responsive to the load of said support for measuring growth of said bar and controlling the rate of growth thereof.

14. The improvement defined in claim 13 wherein said support is provided with a stator juxtaposed with said core and having a field winding energizable to electromagnetically rotate said core.

15. The improvement defined in claim 1 wherein said core is connected to said bar.

16. The improvement defined in claim 15 wherein said source member is a bar of material adopted to form the crystal and connected to a further magnetizable core surrounded by another said radial stabilizer and provided with a respective axial stabilization magnet.

17. The improvement defined in claim 16 for an apparatus for the zone melting of said material which comprises a hermetically sealed housing of nonmagnetic material surrounding said cores and said bars and surrounded in turn by an induction heating coil disposed between said radial stabilizers.

18. The improvement defined in claim 1 wherein said apparatus is a crystal drawing apparatus wherein said source member is a crucible containing a melt of said material and said core is affixed to said crucible.

19. The improvement defined in claim 1 wherein said apparatus is a crystal drawing apparatus wherein said source member is a crucible containing a melt of said material and said core is affixed to said bar.

20. The improvement defined in claim 1 wherein two such radial stabilizers are provided in axially spaced relationship along said core.

* * * * *